United States Patent
Nahas

(10) Patent No.: US 7,370,260 B2
(45) Date of Patent: May 6, 2008

(54) MRAM HAVING ERROR CORRECTION CODE CIRCUITRY AND METHOD THEREFOR

(75) Inventor: Joseph J. Nahas, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 806 days.

(21) Appl. No.: 10/736,852

(22) Filed: Dec. 16, 2003

(65) Prior Publication Data

US 2005/0144551 A1    Jun. 30, 2005

(51) Int. Cl.
*G11C 29/00* (2006.01)

(52) U.S. Cl. ...................... 714/763; 365/158

(58) Field of Classification Search ................ 714/769; 365/158
See application file for complete search history.

(56) References Cited

U.S. PATENT DOCUMENTS

| 4,964,129 | A | 10/1990 | Bowden et al. |
| 5,233,610 | A | 8/1993 | Nakayama et al. |
| 6,347,056 | B1 | 2/2002 | Ledford et al. |
| 6,545,906 | B1 | 4/2003 | Savtchenko et al. |
| 6,584,589 | B1 * | 6/2003 | Perner et al. ............... 714/721 |
| 6,704,230 | B1 * | 3/2004 | DeBrosse et al. ........... 365/201 |
| 2003/0023922 | A1 * | 1/2003 | Davis et al. ................ 714/763 |
| 2003/0023928 | A1 * | 1/2003 | Jedwab et al. .............. 714/763 |

\* cited by examiner

*Primary Examiner*—Guy J. Lamarre
(74) *Attorney, Agent, or Firm*—Robert L. King; James L. Clingan, Jr.

(57) ABSTRACT

An embedded memory system (10) uses an MRAM core (12) and error correction code (ECC) corrector circuitry (20). The ECC corrector circuitry identifies soft memory bit errors which are errors primarily resulting from an MRAM bit not being correctly programmed. The errors are identified and corrected during a read or a write cycle and not necessarily when the memory is in a special test mode. As errors are corrected, the error corrections are counted by an error counter (24) to create a count value. The count value is stored in the MRAM core itself and can later be retrieved and read during a test mode for an indication of how many bit corrections are required for the MRAM core over a period of time. The count value is stored by using an unused portion of a write memory cycle during a read operation.

27 Claims, 2 Drawing Sheets

MRAM HAVING ERROR CORRECTION CODE CIRCUITRY AND METHOD THEREFOR

FIELD OF THE INVENTION

This invention relates to Magnetoresistive Random Access Memories (MRAMs), and more particularly to reliability of operation of MRAMs.

BACKGROUND OF THE INVENTION

Non-volatile memory devices, such as FLASH memories, are extremely important components in electronic systems. FLASH is a major non-volatile memory device in use today. Disadvantages of FLASH memory include high voltage requirements and slow program and erase times. Also, FLASH memory has a poor write endurance of $10^4$-$10^6$ cycles before memory failure. In addition, to maintain reasonable data retention, the scaling of the gate oxide is restricted by the tunneling barrier seen by the electrons. Hence, FLASH memory is limited in the dimensions to which it can be scaled.

To overcome these shortcomings, magnetic memory devices are being evaluated. One such device is magnetoresistive random access memory (hereinafter referred to as "MRAM"). To be commercially practical, however, MRAM must have comparable memory density to current memory technologies, be scalable for future generations, operate at low voltages, have low power consumption, and have competitive read/write speeds.

For an MRAM device, the stability of the nonvolatile memory state, the repeatability of the read/write cycles, and the memory element-to-element switching field uniformity are three of the most important aspects of its design characteristics. A memory state in MRAM is not maintained by power, but rather by the direction of the magnetic moment vector. Storing data is accomplished by applying magnetic fields and causing magnetic material in a MRAM device to be magnetized into either of two possible memory states. Recalling data is accomplished by sensing the resistive differences in the MRAM device between the two states. The magnetic fields for writing are created by passing currents through strip lines external to the magnetic structure or through the magnetic structures themselves.

As the lateral dimension of an MRAM device decreases, several problems occur. First, the switching field increases for a given shape and film thickness, requiring a larger magnetic field to switch. Second, the total switching volume is reduced so that the energy barrier for reversal decreases. The energy barrier refers to the amount of energy needed to switch the magnetic moment vector from one state to the other. The energy barrier determines the data retention and error rate of the MRAM device and unintended reversals can occur due to thermofluctuations (superparamagnetism) if the barrier is too small. A major problem with having a small energy barrier is that it becomes extremely difficult to selectively switch one MRAM device in an array. Selectability allows switching without inadvertently switching other MRAM devices. It is important to control the current flowing during a write operation in the array to avoid undesired current surges or spikes during transistor switching.

Finally, because the switching field is produced by shape, the switching field becomes more sensitive to shape variations as the MRAM device decreases in size. With photolithography scaling becoming more difficult at smaller dimensions, MRAM devices will have difficulty maintaining tight switching distributions.

Since MRAMs are subject to reliability issues when the memory is written or programmed due to these issues, a need exists for an improved nonvolatile memory that is more reliable.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION

Figure 1:
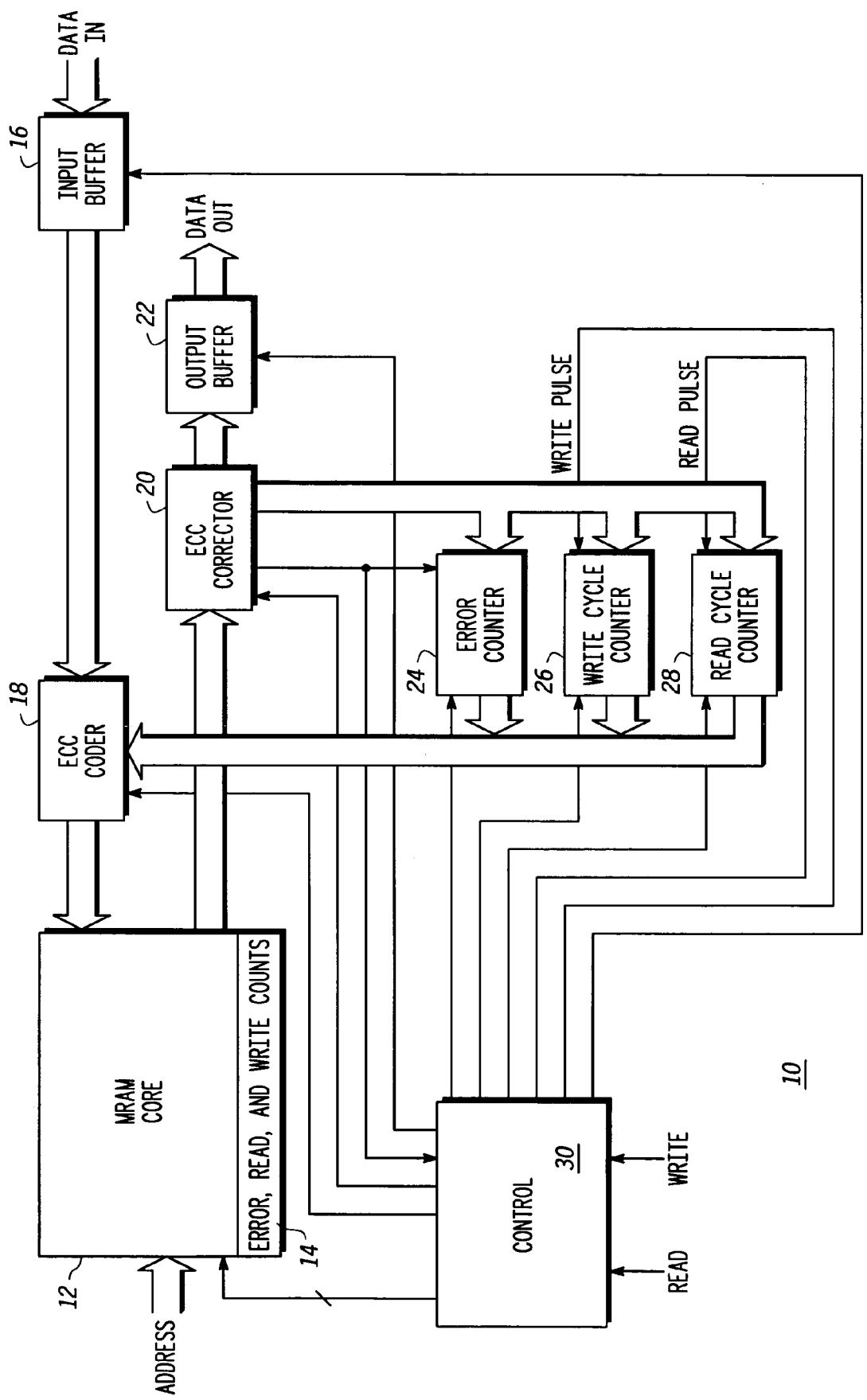
FIG. 1 is a block diagram of an MRAM with an embedded control circuit.

FIG. 1 illustrates an embedded memory system 10 having error correction circuitry with a counter for counting detected errors during normal read and write cycle operation. An MRAM core 12 is generally illustrated. It should be understood that the MRAM core 12 contains column and row decoders, read sense amplifiers and write drivers that are not specifically illustrated. The MRAM is accessed by an address bus that receives an address value labeled "Address". The MRAM core 12 also has an error, read and write counts field 14 that is a special memory location for storing error counts, read cycle counts and write cycle counts. An input buffer 16 has an input coupled to a bus for receiving input data labeled "Data In". An output of the input buffer 16 is connected via a bus to an input of an Error Correction Code (ECC) coder 18. An output of the ECC coder 18 is connected to a data input of the MRAM core 12 via a bus. A data output of the MRAM core 12 is connected via a bus to an input terminal of an ECC corrector 20. A first output of the ECC corrector 20 is connected to an input of an output buffer 22. An output of the output buffer 22 provides output data labeled "Data Out". An error counter 24 has an input connected to a second output of the ECC corrector 20 via a bus. An output of the error counter 24 is connected to a second input of the ECC coder 18 via a bus. The second output of the ECC corrector 20 is also connected to an input of a write cycle counter 26. An output of the write cycle counter 26 is connected to the second input of the ECC coder 18 via the bus that the output of error counter 24 is connected to. The second output of the ECC corrector 20 is also connected to an input of a read cycle counter 28. The output of the read cycle counter 28 is connected to the second input of the ECC coder 18 via the bus that the output of error counter 24 is connected to. A control circuit 30 has a first input for receiving a Read control signal and a second input for receiving a Write control signal. A first output of control circuit 30 is connected to a control terminal of the MRAM core 12. A second output of control circuit 30 is connected to a control input of the ECC coder 18. A third output of the control circuit 30 is connected to a control input of the ECC corrector 20. A fourth output of the control circuit 30 is connected to a control input of the output buffer 22. A fifth output of the control circuit 30 is connected to a control input of the error counter 24. A sixth output of the control circuit 30 is connected to a control input of the write cycle counter 26. A seventh output of the control circuit 30 is connected to a control input of the read cycle counter 28. An eighth output of the control circuit 30 is connected to a second input of the read cycle counter 28 for providing a Read Pulse signal. A ninth output of the control circuit 30 is connected to a second input of the write cycle counter 26 for providing a Write Pulse signal. A tenth output of the control circuit 30 is connected to a second input of the input buffer 16 for controlling storage timing of input buffer 16. A third output of the ECC corrector 20 is connected to a third input of the error counter 24 and to a third input of the control circuit 30.

In operation during a Write memory cycle, assume that data is received and stored by input buffer 16 under control of the control signal provided by control circuit 30 when the Write signal is active. The input data is connected to the ECC coder 18 in response to ECC coder 18 receiving an active control signal from control circuit 30. The ECC coder 18 adds redundancy code to the data before being stored in the MRAM core 12. The redundancy code is one of several error correction codes known in the art, such as, for example, a Hamming code. The write cycle counter 26 is incremented on each write cycle by control circuit 30.

During a Read memory cycle under the control of control circuit 30 after the assertion of the Read signal, data with its redundancy code is transferred to the ECC corrector 20 from the MRAM core 12. ECC corrector 20 checks the data and redundancy code correcting error(s), if any, and transfers the data to the output buffer 22 under control of control circuit 30. If an error is detected, error counter 24 is incremented by a signal from ECC corrector 20. The signal from the ECC corrector 20 also is provided to the control circuit 30. The read cycle counter 28 is incremented on each read cycle by control circuit 30.

After the ECC corrector 20 signals the control circuit 30 that an error has occurred, the control circuit 30 generates control signals to store the values in the error counter 24, write cycle counter 26 and read cycle counter 28 in error, read and write counts field 14 of MRAM core 12. To do this storage operation, the control circuit 30 causes the error counter 24 to transfer its current value to ECC coder 18 which adds redundancy code to the current value and stores the information in error, read and write counts field 14 of MRAM core 12. Likewise, the control circuit 30 causes the write cycle counter 26 to transfer its current value to ECC coder 18 which adds redundancy code to the current value and stores the information in error, read and write counts field 14 of MRAM core 12. The control circuit 30 causes the read cycle counter 28 to transfer its current value to ECC coder 18 which adds redundancy code to the current value and stores the information in error, read and write counts field 14 of MRAM core 12.

In another form, the control circuit 30 may be implemented to force error counter 24, write cycle counter 26 and read cycle counter 28 to transfer their respective count values to the MRAM core 12 for storage in error, read and write counts field 14. The forced transfer may be implemented either periodically or selectively based upon any of predetermined criteria.

When the MRAM core 12 is initialized or powered up, the control circuit 30 restores the error count, write cycle count and read cycle count, respectively, to the error counter 24, write cycle counter 26 and read cycle counter 28 from their values stored in MRAM core 12 at error, read and write counts field 14. The various control signals provided by control circuit 30 and illustrated in FIG. 1 implement this initialization of the counters.

Figure 2:
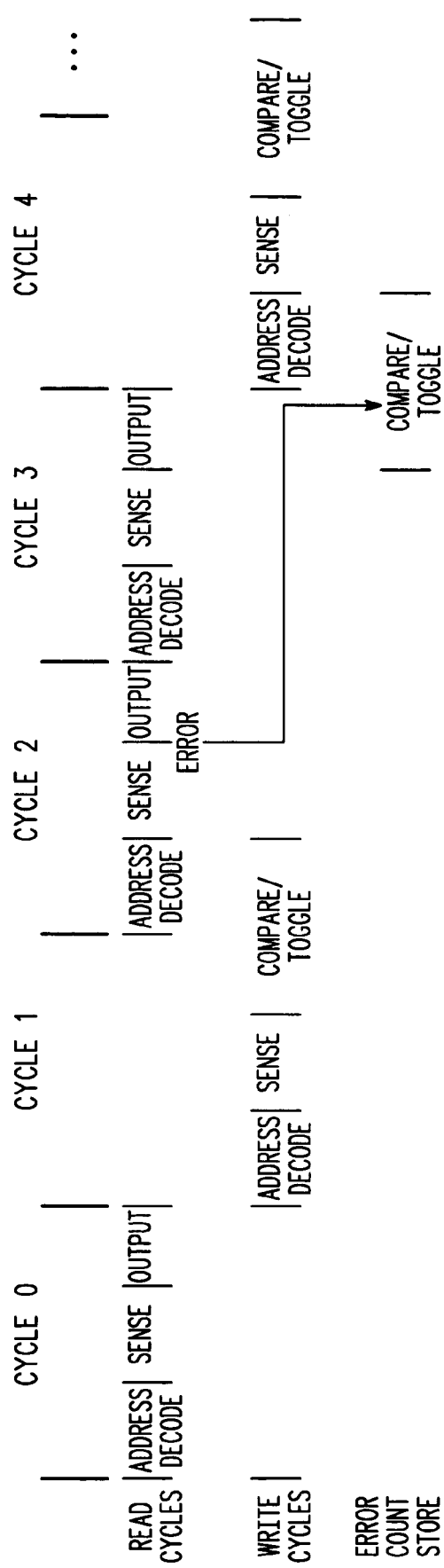
FIG. 2 is a cycle timing diagram illustrating timing coordination of error processing between read and write memory cycles.

Illustrated in FIG. 2 is a timing diagram that illustrates an exemplary timing of MRAM core 12. For purposes of illustration only, five successive cycles are provided out of a series of continuous memory cycles. Additionally, in this example, the MRAM core 12 is assumed to a magnetoresistive random access memory that is a toggle memory, such as described in U.S. Pat. No. 6,545,906 entitled "Method of Writing To Scalable Magnetoresistance Random Access Memory Element". Each of the memory cycles, whether it is a read cycle or a write cycle, contains an address decode portion and a sense portion. In addition, the read cycles each contain a portion to output data. Separately, the write cycles each contain a portion for comparing a stored bit with a new data bit and then, if necessary, toggling the bit to reverse the stored value. In this illustrated form, cycles 0, 2 and 3 are read cycles and cycles 1 and 4 are write cycles. Each cycle is substantially the same time length in the illustrated form but do not necessarily need to be. Illustrated in cycle 2, an error is detected by ECC corrector 20 during a read operation. The controller 30 can then store the error count, write cycle count and read cycle count by using the otherwise unused ECC coder 18 and compare/toggle circuitry in MRAM core 12 (not shown) during any subsequent read cycle(s) and the address portion of the following cycle(s). It should be noted that the compare and toggle operation of a write cycle could complete during cycle 1 and cycle 4 depending upon the time length of cycles 1 and 4, respectively. Such completion makes use of the address decode portion of a following cycle unnecessary. While the cycles in FIG. 2 are illustrated as having the same length (i.e. synchronous), the operation described herein also is applicable when the cycle lengths vary and asynchronous operation occurs. Whether one or multiple subsequent read cycles are required to update the counter information in MRAM core 12 depends upon the selected bit widths of the count values and memories. For example, in FIG. 2 the updating in MRAM core 12 of the error count value resulting from the error in cycle 2 is performed in at the end of cycle 3 because cycle 3 happened to be a read cycle. If cycle 3 had been a write cycle then updating of the count value would have to be deferred at least until the next read cycle because otherwise the ECC coder 18 and compare/toggle circuitry is used during write cycles. While the error is illustrated in FIG. 2 as occurring during a read cycle, it should be understood that the counting applies equally in an analogous manner for detected errors during a write cycle.

By now it should be apparent that there has been provided an MRAM having ECC circuitry for detecting and correcting soft errors (i.e. random, seldom repeated errors that are not caused from hardware flaws). The MRAM has embedded circuitry (i.e. circuitry contained in a same integrated circuit) that keeps a count value of the number of errors detected, a total number of read cycles executed and the total number of write cycles executed from the time of initial operation of the MRAM.

The count value is stored in the MRAM during normal operation of the memory and not only during a test of the MRAM or when the MRAM is placed in some other special mode of operation. In other words, detected errors may also be counted during a test mode. However, the control circuit 30 may be configured by a user or programmed to omit the counting of errors during predetermined operational modes, including test. Therefore, the MRAM circuitry described herein permits continuous monitoring of an MRAM memory in use. Because MRAM memories are non-volatile, the error count value stored in the MRAM remains cumulative regardless of whether the MRAM is powered or not.

However, it should be understood that control circuit 30 may reinitialize the error count if desired as well as reinitializing either or both of the read cycle count and the write cycle count. The memory operation described herein functions for any type of magnetoresistive random access memory regardless of its principle of operation. Additionally, the memory used herein may be any type of nonvolatile random access memory (NVRAM) in addition to MRAM, such as ovonic memories.

In one form there is herein provided a memory circuit having a magnetoresistive random access memory (MRAM) core for storing data received by the memory circuit and outputting stored data and a having a reserved portion. An error correction code (ECC) coder adds a redundancy code to the data for storing in the MRAM core. An ECC corrector is coupled to the memory core for performing an analysis of the stored data and the redundancy code to detect and correct errors in the stored data output by the MRAM core and provides an error signal when an error is detected during the performing of the analysis. An error counter is coupled to the ECC corrector and the MRAM core for providing a count of occurrences of the error signal for storage in the reserved portion of the MRAM core. In one form the error counter is coupled to the MRAM core by the ECC coder. In another form the memory circuit further comprises a write cycle counter for providing a count of occurrences of writing data in the MRAM core for storage in the reserved portion of the MRAM core. In yet another form the memory circuit further has a read cycle counter for providing a count of occurrences of reading data from the MRAM core for storage in the reserved portion of the MRAM core. In one form the read cycle counter and the write cycle counter are coupled to the MRAM core by the ECC coder. In another form the memory circuit further includes control circuitry for initiating writing the count of the error counter during an end portion of a read cycle and completing writing the count of the error counter before or during a beginning portion of a cycle immediately following the read cycle. In a further form the control circuitry causes performance of a read operation, a compare operation, and a write operation to perform a write cycle. In another form a memory circuit has a non-volatile random access memory (NVRAM) core for storing data received by the memory circuit and outputting stored data. An ECC corrector is coupled to the NVRAM core, for performing an analysis of stored data fetched from the NVRAM core during a read cycle of the NVRAM core to detect and correct errors in the stored data output by the NVRAM core and providing an error signal when an error is detected from the performing of the analysis. An error counter is coupled to the ECC corrector and the NVRAM core for providing a count of occurrences of the error signal for storage in the NVRAM core. The memory circuit further includes an ECC coder, coupled to the NVRAM core, for adding a redundancy code to the data for storing in the NVRAM core. The ECC corrector performs an analysis of the redundancy code to detect and correct errors. The NVRAM core has a reserved portion and the count of the error counter is stored in the reserved portion. In one form the error counter is coupled to the NVRAM core by the ECC coder. In another form the memory circuit further includes a write cycle counter for providing a count of occurrences of writing data in the NVRAM core for storage in the NVRAM core. In another form the memory circuit further includes a read cycle counter for providing a count of occurrences of reading data from the NVRAM core for storage in the NVRAM core. In one embodiment the read cycle counter and the write cycle counter are coupled to the NVRAM core by the ECC coder.

In one form the NVRAM core is a magnetoresistive random access memory core and further includes control circuitry for initiating writing the count of the error counter before or during an end portion of a read cycle and completing writing the count of the error counter during a beginning portion of a cycle immediately following the read cycle. In another form the control circuitry causes performance of a read operation, a compare operation, and a toggle operation to perform a write cycle. There is also provided a method of operating a memory circuit having a non-volatile random access memory (NVRAM) core. Data received by the memory circuit is stored in the NVRAM core. The data stored in the NVRAM core is output. An analysis of the data output from the NVRAM core is performed to detect and correct errors therein. A count of detected errors is obtained. The count in the NVRAM is stored. In one form a redundancy code is stored with the data in the NVRAM core. In another form the analysis includes analyzing the redundancy code. In one form storing the count includes initiating the storing of the count during an end portion of a next read cycle of the memory circuit after an error has been detected and completing the storing of the count before or during an initial portion of a cycle immediately following the next read cycle. In one form the NVRAM core is a magnetoresistive random access memory core and the cycle immediately following the next read cycle is a write cycle. The write cycle in one form has a read operation, a compare operation, and toggle operation. In another form the non-volatile random access memory (NVRAM) core is implemented with bit cells having storage values that are changed by toggling their state. In one form a count of read cycles is made. The count of read cycles is stored in the NVRAM core. A count of write cycles is obtained. The count of write cycles is stored in the NVRAM core. In another form the count of detected errors is compared to the count of write cycles. In yet another form the count of detected errors is compared to the count of read cycles. In a further form the count of detected errors is compared to a sum of the count of read cycles and the count of write cycles.

Various changes and modifications to the embodiments herein chosen for purposes of illustration will readily occur to those skilled in the art. For example, although a toggle programming MRAM is discussed for some applications, it should be apparent that other types of memory cells may utilize the features disclosed herein. The circuitry may be implemented with transistors of various types and having any type of conductivity. Various types of counters may be used to implement the counting functions discussed herein. To the extent that such modifications and variations do not depart from the spirit of the invention, they are intended to be included within the scope thereof which is assessed only by a fair interpretation of the following claims.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A memory circuit, comprising:
   a magnetoresistive random access memory (MRAM) core for storing data received by the memory circuit and outputting stored data, the magnetoresistive random access memory (MRAM) core having a reserved portion;
   an error correction code (ECC) coder for adding a redundancy code to the data for storing in the magnetoresistive random access memory (MRAM) core;
   an ECC corrector, coupled to the magnetoresistive random access memory (MRAM) core, for performing an analysis of the stored data and the redundancy code to detect and correct errors in the stored data that is output by the magnetoresistive random access memory (MRAM) core and providing an error signal when an error is detected from the analysis;
   an error counter, coupled to the ECC corrector, the ECC coder and the magnetoresistive random access memory (MRAM) core, for providing a count of occurrences of the error signal for storage in the reserved portion of the magnetoresistive random access memory (MRAM) core by using an unused portion of a write memory cycle during a read operation to implement said storage;
   a write cycle counter coupled to the ECC corrector, the ECC coder and the magnetoresistive random access memory (MRAM) core for providing a count of write cycles for storage in the reserved portion of the magnetoresistive random access memory (MRAM) core in response to the error; and
   a read cycle counter coupled to the ECC corrector, the ECC coder and the magnetoresistive random access memory (MRAM) core for providing a count of read cycles for storage in the reserved portion of the magnetoresistive random access memory (MRAM) core in response to the error.

2. The memory circuit of claim 1, wherein the magnetoresistive random access memory (MRAM) core is a toggle memory.

3. The memory circuit of claim 1, wherein each read cycle that is counted by the read cycle counter comprises an address decode, a sense and an output operation, and each write cycle that is counted by the write cycle counter comprises an address decode, a sense and a compare and selective toggle operation.

4. The memory circuit of claim 3, wherein each write cycle operation overlaps in time with the address decode of a following cycle.

5. The memory circuit of claim 4, wherein read cycles are not of same time duration as write cycles.

6. The memory circuit of claim 1, further comprising control means coupled to the magnetoresistive random access memory (MRAM) core, the error correction code (ECC) coder, the error counter, the write cycle counter and the read cycle counter for initiating writing the count of the error counter during an end portion of a read cycle and completing writing the count of the error counter before or during a beginning portion of a cycle immediately following the read cycle.

7. The memory circuit of claim 6, wherein the control means causes performance of a read operation, a compare operation, and a toggle operation to perform a write cycle.

8. A memory circuit, comprising:
   a non-volatile random access memory (NVRAM) core for storing data received by the memory circuit and outputting stored data;
   an ECC coder, coupled to the non-volatile random access memory (NVRAM) core, for adding a redundancy code to the data for storing in the non-volatile random access memory (NVRAM) core;
   an ECC corrector, coupled to the non-volatile random access memory (NVRAM) core, for performing an analysis of stored data fetched from the non-volatile random access memory (NVRAM) core during a read cycle of the non-volatile random access memory (NVRAM) core to detect and correct errors in the stored data that is output by the non-volatile random access memory (NVRAM) core and providing an error signal when an error is detected from the analysis;
   an error counter, coupled to the ECC corrector and the non-volatile random access memory (NVRAM) core, for providing a count of occurrences of the error signal for storage in the non-volatile random access memory (NVRAM) core by using an unused portion of a write memory cycle during a read operation to implement said storage;
   a write cycle counter coupled to the ECC corrector, the ECC coder and the NVRAM core for providing a count of write cycles for storage in the reserved portion of the NVRAM core in response to an error; and
   a read cycle counter coupled to the ECC corrector, the ECC coder and the NVRAM core for providing a count of read cycles for storage in the reserved portion of the NVRAM core in response to the error.

9. The memory circuit of claim 8, wherein the NVRAM core is a toggle magnetoresistive random access memory.

10. The memory circuit of claim 9, wherein the ECC corrector is further characterized as performing an analysis of the redundancy code to detect and correct errors and enables values in the error counter, the write cycle counter and the read cycle counter to be stored in the NVRAM core in response to detecting any error.

11. The memory circuit of claim 10, wherein the non-volatile random access memory (NVRAM) core has a reserved portion and the count of the error counter is stored in the reserved portion.

12. The memory circuit of claim 9, wherein each read cycle that is counted by the read cycle counter comprises an address decode, a sense and an output operation, and each write cycle that is counted by the write cycle counter comprises an address decode, a sense and a compare and selective toggle operation.

13. The memory circuit of claim 12, wherein the read cycle counter provides the count of read cycles to the ECC coder for adding redundancy code to the count of read cycles prior to storage in the reserved portion of the NVRAM core.

14. The memory circuit of claim 13, wherein each write cycle operation overlaps in time with the address decode of a following cycle.

15. The memory circuit of claim 8, wherein the error counter is coupled to the non-volatile random access memory (NVRAM) core by the ECC coder.

16. The memory circuit of claim 8, further comprising control means for initiating writing the count of the error counter during an end portion of a read cycle and completing writing the count of the error counter before or during a beginning portion of a cycle immediately following the read cycle.

17. The memory circuit of claim 16, wherein the control means causes performance of a read operation, a compare operation, and a toggle operation to perform a write cycle.

18. A method of operating a memory circuit having a non-volatile random access memory (NVRAM) core, comprising:
   storing data received by the memory circuit in the non-volatile random access memory (NVRAM) core;
   outputting the data stored in the non-volatile random access memory (NVRAM) core;
   performing an analysis of the data output from the non-volatile random access memory (NVRAM) core to detect and correct errors therein;
   obtaining a count of detected errors, a count of write cycles and a count of read cycles; and
   storing the count of detected errors, count of write cycles and count of read cycles in the non-volatile random access memory (NVRAM) core using an unused portion of a write memory cycle during a read operation.

19. The method of claim 18, further comprising:
   storing a redundancy code with the data in the non-volatile random access memory (NVRAM) core.

20. The method of claim 19, wherein the performing the analysis further comprises analyzing the redundancy code.

21. The method of claim 20, wherein storing the count further comprises:
   initiating the storing of the count during an end portion of a next read cycle of the memory circuit after an error has been detected; and
   completing the storing of the count before or during an initial portion of a cycle immediately following the next read cycle.

22. The method of claim 21 further comprising implementing the non-volatile random access memory (NVRAM) core as a magnetoresistive random access memory core and implementing the cycle immediately following the next read cycle as a write cycle, wherein the write cycle comprises a read operation, a compare operation, and a toggle operation.

23. The method of claim 18 further comprising implementing the non-volatile random access memory (NVRAM) core with bit cells having storage values that are changed by toggling their state.

24. The method of claim 18, further comprising:
   implementing memory read cycles and memory write cycles having cycle lengths that vary.

25. The method of claim 24, further comprising:
   comparing the count of detected errors to the count of write cycles.

26. The method of claim 24, further comprising:
   comparing the count of detected errors to the count of read cycles.

27. The method of claim 24, further comprising:
   comparing the count of detected errors to a sum of the count of read cycles and the count of write cycles.

* * * * *